United States Patent
Machida

(10) Patent No.: US 7,663,253 B2
(45) Date of Patent: Feb. 16, 2010

(54) BOARD HAVING ELECTRONIC PARTS MOUNTED BY USING UNDER-FILL MATERIAL AND METHOD FOR PRODUCING THE SAME

(75) Inventor: Yoshihiro Machida, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 93 days.

(21) Appl. No.: 11/463,169

(22) Filed: Aug. 8, 2006

(65) Prior Publication Data
US 2007/0045867 A1    Mar. 1, 2007

(30) Foreign Application Priority Data
Aug. 26, 2005   (JP)   .............................. 2005-245547

(51) Int. Cl.
*H01L 23/28* (2006.01)
(52) U.S. Cl. ..................... 257/787; 257/789; 257/795; 438/124
(58) Field of Classification Search .............. 257/778, 257/783, 724, 787, 788–789, E23.001, E23.194, 257/E21.449, E21.519; 438/124
See application file for complete search history.

(56) References Cited

U.S. PATENT DOCUMENTS

| | | | |
|---|---|---|---|
| 5,536,765 A * | 7/1996 | Papathomas | ................ 524/100 |
| 6,977,338 B1 | 12/2005 | Muro et al. | |
| 2001/0004130 A1* | 6/2001 | Higashi et al. | .............. 257/686 |
| 2003/0113952 A1 | 6/2003 | Sambasivam et al. | |
| 2004/0178510 A1* | 9/2004 | Sunohara et al. | ............ 257/781 |

FOREIGN PATENT DOCUMENTS

| | | |
|---|---|---|
| EP | 1 447 850 | 8/2004 |
| JP | 2000-164610 | 6/2000 |

* cited by examiner

*Primary Examiner*—Theresa T Doan
(74) *Attorney, Agent, or Firm*—Rankin, Hill & Clark LLP

(57) ABSTRACT

A board 1 according to the present invention includes a board main body 3; electronic parts 5 electrically connected to and mounted on the board main body 3; and an under-fill material 19 with which a part between the board main body 3 and a surface of the electronic parts 5 electrically connected to the board main body is filled. A hole 21 passing through a layer 19*a* of the under-fill material that flows outside from a connecting area of the electronic parts 5 and the board main body 3 is provided for electrically connecting other parts to the board main body.

3 Claims, 5 Drawing Sheets

BOARD HAVING ELECTRONIC PARTS MOUNTED BY USING UNDER-FILL MATERIAL AND METHOD FOR PRODUCING THE SAME

BACKGROUND OF THE INVENTION

The present invention relates to a board and a method for producing the same. More particularly, the present invention relates to a board on which electronic parts are mounted by using an under-fill material and a method for producing the board.

As a method for mounting electronic parts, for instance, a semiconductor chip on a board such as a wiring board with high density, a flip chip bonding method is known. In the flip chip bonding method, a solder bump is provided on an electrode pad of the semiconductor chip so that the chip is mounted on an electrode pad formed in the board on which the chip is to be mounted so as to be aligned with the electrode of the chip through the solder bump. A gap between the mounted chip and the board is filled with an under-fill material mainly for the purpose of preventing a stress resulting from a difference in coefficient of thermal expansion between the chip and the board from being concentrated to a solder bump connected part. As the under-fill material, a resin including filler such as silica is employed.

The under-fill material is injected to a part between the chip and the board by a capillary action, and then hardened by heating. When the under-fill material is heated, the fluidity of the resin of the under-fill material is increased so that a part of the under-fill material flows outside from the part between the chip and the board. To avoid the insufficiency (causing a void) of the under-fill material with which the part between the chip and the board is filled, the under-fill material is ordinarily somewhat excessively used. This also promotes the outflow of the under-fill material by heating it.

When there is a pad for connecting other parts to the board on the surface of the board on which the chip is mounted, the flowing out under-fill material may possibly reach the area of the pad so that the under-fill material prevents the connection of other parts to the board. In order to meet such a problem, various proposals have been hitherto made. For instance, as disclosed in Patent Document 1, a technique has been known that a dam groove is formed for preventing the expansion of the under-fill material flowing out on a solder resist on which the pad of the board protrudes or a technique that a dam frame for preventing the expansion of the under-fill material is attached to the solder resist in place of the dam groove. As a technique for improving these techniques, the Patent Document 1 discloses a technique that a process (a process for applying another material to the solder resist, a roughening process by applying a laser on the surface of a solder resist, etc.) is carried out so that a part of the surface of the solder resist is apt to readily repel the under-fill material without using the dam groove or the dam frame to prevent the outflow of the under-fill material.

[Patent Document 1] JP-A-2000-164610

In the usual techniques for preventing the under-fill material from flowing out, a part having the under-fill material flowing out from a chip area cannot be used for connecting other parts than the chip. Accordingly, such techniques for preventing the outflow cause a factor of preventing a mounting with a higher density. Further, in the technique for treating the surface of the solder resist, an operation for applying another material or applying the laser is added.

SUMMARY OF THE INVENTION

Thus, it is an object to provide a board in which a mounting density is more improved without a necessity for using a groove or a frame by a related art or using physical restricting means of the outflow of an under-fill material such as a surface treated area.

According to the present invention, there is provided a board with electronic parts mounted by using an under-fill material, the boar including: a board main body; electronic parts electrically connected to and mounted on the board main body; and an under-fill material with which a part between the board main body and a surface of the electronic parts electrically connected to the board main body is filled, wherein a hole passing through a layer of the under-fill material that flows outside from a connecting area of the electronic parts and the board main body is provided for electrically connecting other parts to the board main body.

The board according to the present invention may further include: an insulating layer in which the electronic parts are embedded, wherein a through hole formed in the insulating layer communicates with the hole passing through the layer of the under-fill material.

Further, the hole passing through the layer of the under-fill material and the hole formed in the insulating layer may be filled with a conductor material for electrically connecting different layers together.

The board according to the present invention can be produced by a method for producing a board including the steps of: connecting the electronic parts to a board main body; filling a part between the electronic parts and the board main body with the under-fill material; and forming a hole for connecting other parts to the board main body in the board main body, wherein the hole passes through a layer of the under-fill material that flows outside from a connecting area of the electronic parts and the board main body.

After the part between the electronic parts and the board main body is filled with the under-fill material, an insulating layer for covering the electronic parts may be formed, and holes may be successively formed in the insulating layer and the layer of the under-fill material to form holes for connecting other parts to the board main body. The hole for connecting other parts to the board main body is preferably formed by a laser process.

According to the present invention, a board can be provided on which a wiring capable of more improving a mounting density can be formed without using a groove or a frame or physical restricting means of the output of an under-fill material such as a surface treated area.

DETAILED DESCRIPTION OF THE PREFERRED EMBODIMENTS

Figure 1:
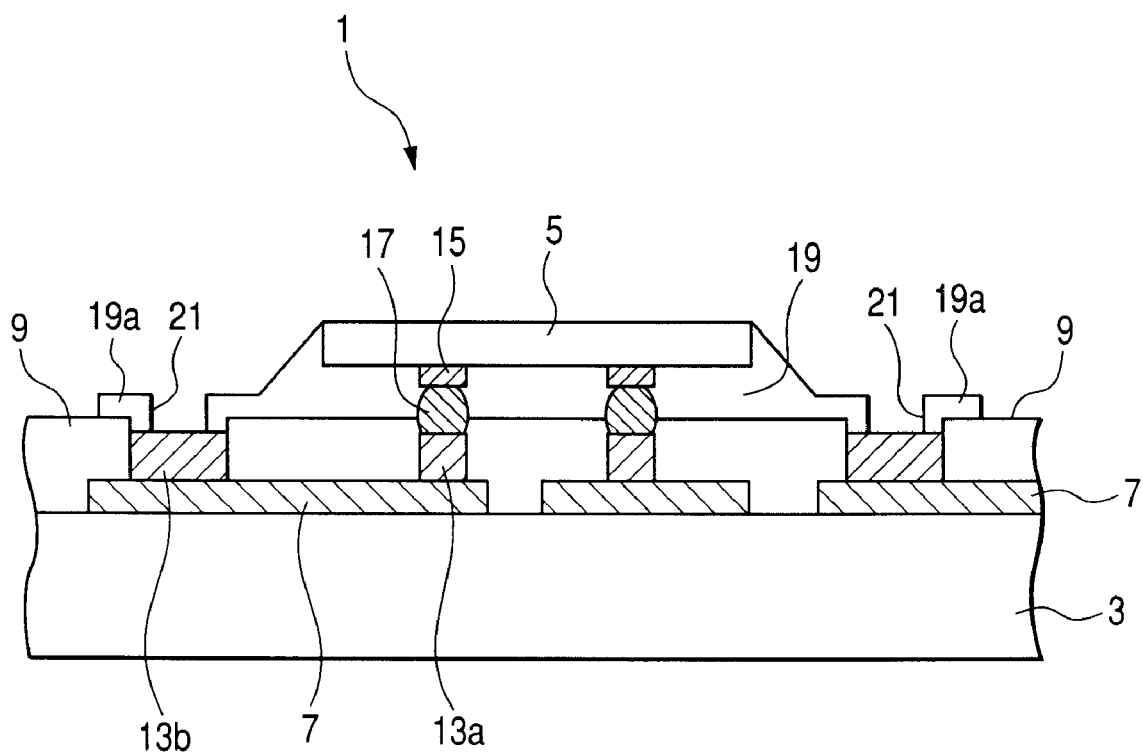
FIG. 1 is a schematic view for explaining a board of the present invention.

FIG. 1 schematically shows a board 1 according to the present invention. The board 1 of the present invention shown in FIG. 1 includes a board main body 3 and electronic parts 5. The board main body 3 and the electronic parts 5 are electrically connected to each other by connecting their electrode pads 13a and 15 together by a connecting member 17. The electrode pad 13a of the board main body 3 is formed in an opening part provided in a solder resist layer 9 for covering the wiring 7 of the board main body 3 and connected to the wiring 7. On the board main body 3, an electrode pad 13b is also provided for electrically connecting other parts (not shown in the drawing) than the electronic parts 5 to the board main body. The connecting member 17 is ordinarily formed by allowing a solder bump arranged on the electrode pad 15 of the electronic parts 5 before a connection to re-flow during the connection. A part between the solder resist layer 9 and the electronic parts 5 is filled with an under-fill material 19. A part of the under-fill material 19 flows outside a connecting area of the board main body 3 and the electronic parts 5 during heating for hardening the under-fill material to form a thin layer 19a in the periphery of the electronic parts 5. In the thin under-fill material layer 19a in the periphery of the electronic parts 5, a hole 21 passing through the layer 19a is provided so as to expose an upper part of the electrode pad 13b of the board main body 3.

As the board main body 3, a core board or a build-up board generally used for producing a multi-layer wiring board can be employed. The wiring 7 of the board main body 3 is formed with a conductor such as copper. The pads 13a and 13b connected to the wiring 7 is made of a conductor formed with, for instance, nickel, and then gold.

A representative example of the electronic parts 5 mounted on the board main body 3 is a semiconductor chip. Further, as the electronic parts 5, for instance, package parts having the semiconductor chip accommodated in an outer casing may be used.

As the under-fill material 19, an ordinary under-fill material may be employed that is used for the purpose of preventing a stress resulting from a difference in coefficient of thermal expansion between the board main body 3 and the electronic parts 5 from being concentrated to the connecting member 17. A representative under-fill material is a thermo-setting resin material such as epoxy including filler of an inorganic material (for instance, silica particles).

By referring to FIGS. 2A and 2B, a production of the board of the present invention will be described.

Figure 2A:
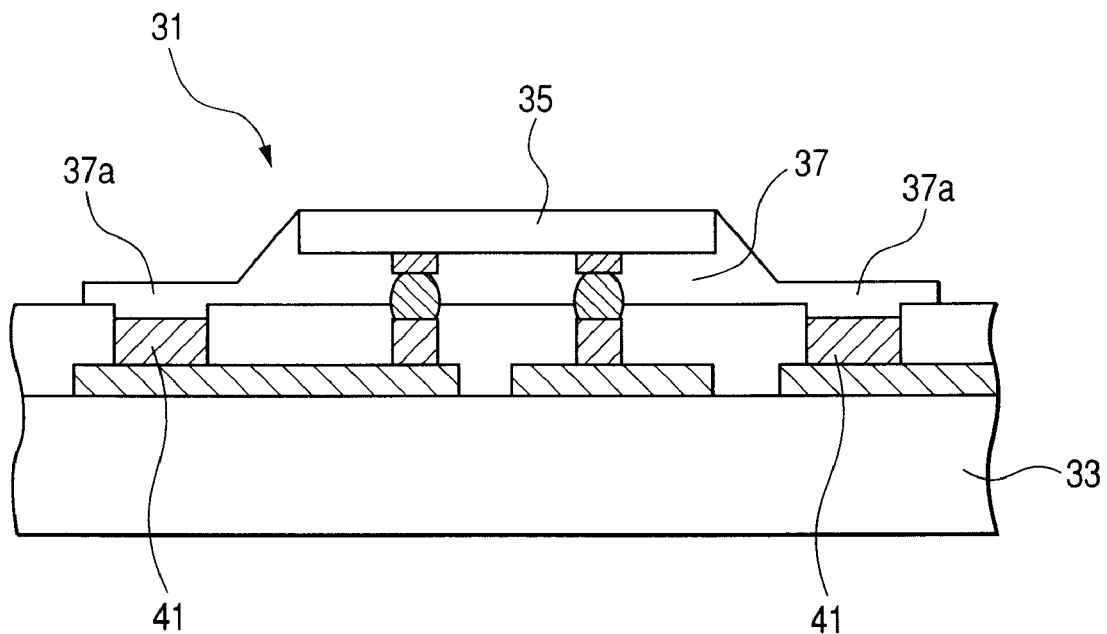
FIGS. 2A and 2B are diagrams for explaining a production of the board of the present invention.

As shown in FIG. 2A, electronic parts 35 is connected to a board main body 33 by a flip chip bonding method. A part between the board main body and the electronic parts is filled with an under-fill material 37, the under-fill material is heated and hardened to produce a board 31 as an intermediate product. In the board 31 of the intermediate product, in the periphery of the electronic parts 35, a thin layer 37a is located that is formed with the under-fill material flowing outside from an area in which the electronic parts 35 is mounted during heating and hardening the under-fill material. Under the thin layer 37a of the under-fill material, a pad 41 of the board main body 33 is located that is used for connecting afterward other parts (not shown in the drawing) than the electronic parts 35 to the wiring of the board main body. The pad 41 of the board main body 33 is advantageously formed to be rather thick. The reason thereof is described below. Since the layer 37a formed with the under-fill material flowing to the periphery of the electronic parts 35 has substantially a uniform thickness, as the pad 41 becomes thicker, the thickness of the layer 37a located thereon is more reduced, so that a drilling work applied to the layer 37a afterward is easily performed.

Figure 2B:
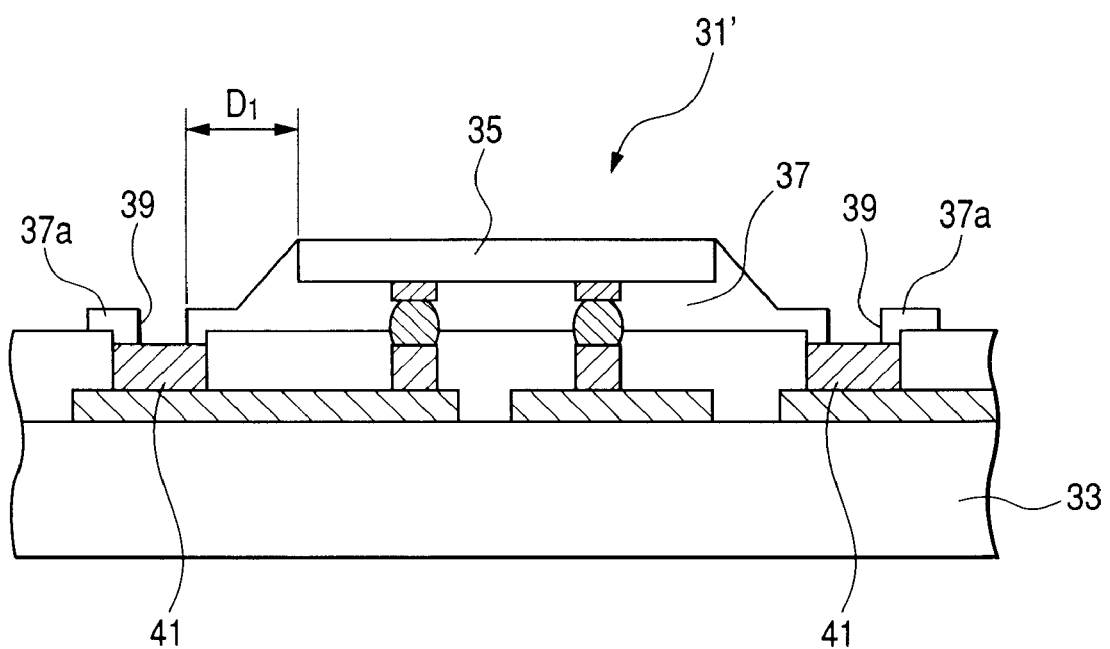

Subsequently, as shown in FIG. 2B, on the thin layer 37a made of the under-fill material in the periphery of the electronic parts 35, a hole 39 is formed so as to expose the pad 41 of the board main body 33. The hole 39 can be formed by, for instance, a laser process. It has been known that the laser process is hardly applied to the under-fill material having a filler content more than that of a build-up material (a resin material ordinarily including a filler content as low as about 20 to 30%). However, for instance, a laser processing machine such as a UV-YAG device (produced by esi corporation) in which a work by the action of heat can be performed is employed so that the drilling work of the under-fill material layer 37a can be carried out. During the laser process, a laser output needs to be controlled so that a harmful influence is not given to the electronic parts 35 adjacent to the hole 39. Accordingly, a diameter worked by a laser is ordinarily made to be small and the diameter of a hole to be formed is preferably gradually enlarged. For instance, a small hole is firstly opened at a central part of the hole to be formed, a position irradiated with a laser beam is spirally gradually moved outward so that the hole 39 having a desired diameter (for instance, 100 μm) can be opened with a good working accuracy. During the laser process, the pad 41 of the layer 37a serves as a stopper so that the processing work can be stopped when the depth of the formed hole 39 reaches the pad 41. The hole of the layer 37a may be opened by a machining work such as a drilling work. However, in the case of the machining work, an influence of vibration to the electronic parts 35 needs to be considered. Further, since the pad 41 under the layer 37a does not serve as a stopper more effective than that in the case of the laser process, the thickness of the pad 41 also needs to be considered.

In such a way, a board 31' (FIG. 2B) of the present invention is obtained that has the through hole 39 provided in the thin under-fill layer 37a in the periphery of the electronic parts 35 so as to expose the upper part of the electrode pad 41 of the board main body 33.

Figure 3A:
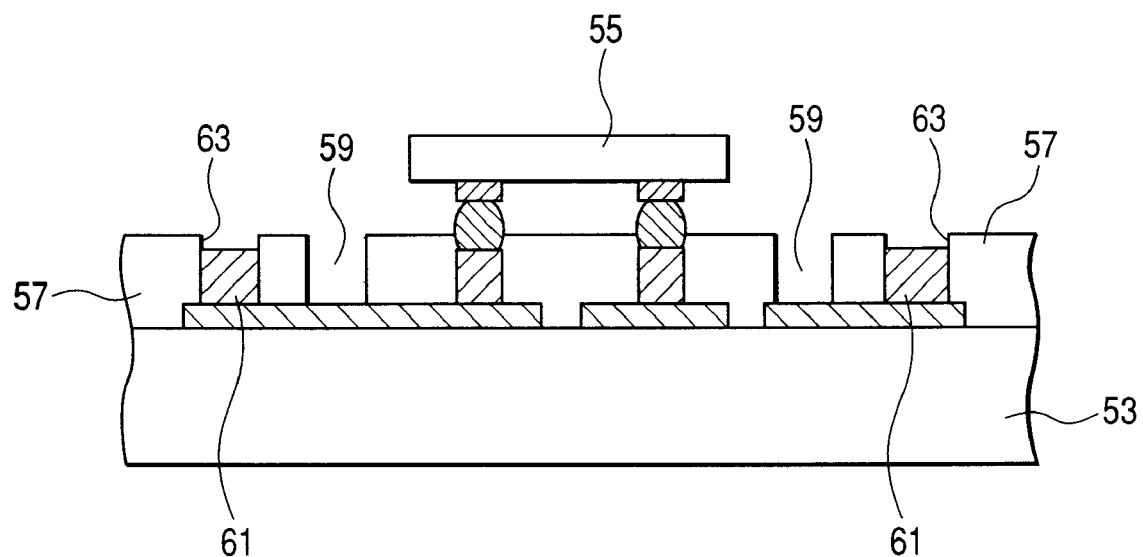
FIGS. 3A and 3B are diagrams for explaining a production of a board according to a related art.
Figure 3B:
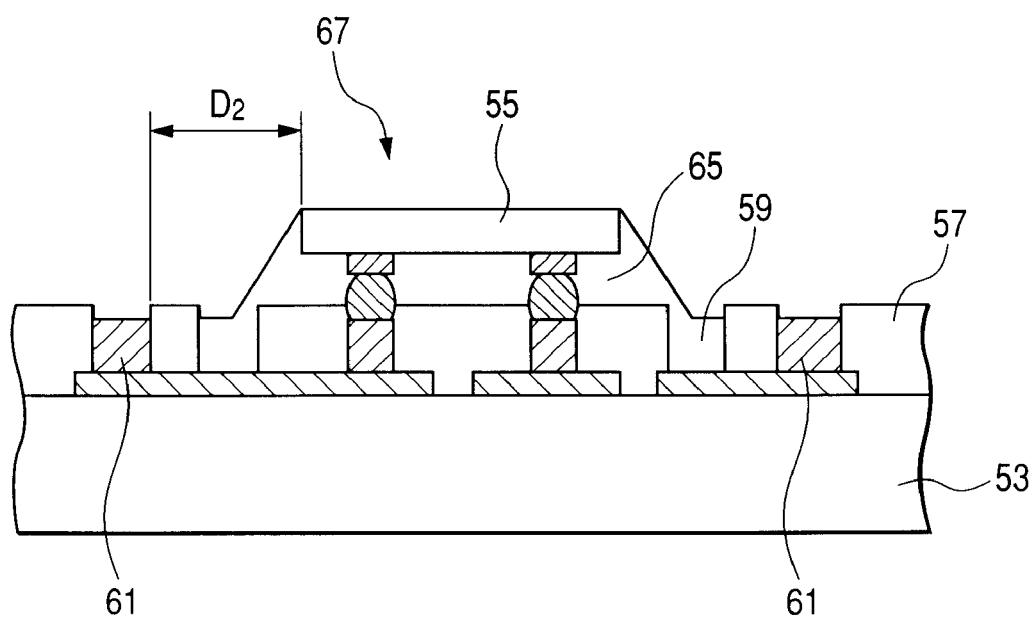

Now, a production of a board according to a related art will be described below. In this case, as shown in FIG. 3A, means 59 for preventing the outflow of an under-fill material is provided on a solder resist layer 57 of a board main body 53 on which electronic parts 55 is mounted by a flip chip bonding method. The under-fill material outflow preventing means 59 shown in this drawing is a dam groove formed in the solder resist layer 57. Further, on the solder resist layer 57 outside the dam groove as the under-fill material outflow preventing means, a hole 63 is provided that communicates with a pad 61 used for electrically connecting other parts (not shown in the drawing) than the electronic parts 55 to the board main body. Then, as shown in FIG. 3B, a part between the solder resist layer 57 and the electronic parts 55 is filled with an under-fill material 65 and the under-fill material is hardened by heating it. The under-fill material flowing out by heating is received by the dam groove 59 to prevent a further outflow.

When the positions of the pads used for connecting other parts than the electronic parts to the board main bodies are compared with each other in the board 31' shown in FIG. 2B according to the present invention and a board 67 shown in FIG. 3B according to the related art, it is understood that the pad 41 of the board 31' of the present invention is located at a position nearer to the electronic parts than the pad 61 of the board 67 according to the related art. More specifically, in the board 31' of the present invention, a space $D_1$ (FIG. 2B) between the electronic parts 35 and the pad 41 can be set to about 2 mm. On the other hand, in the board 67 according to the related art, as a space $D_2$ (FIG. 3B) between the electronic parts 55 and the pad 61, at least 5 mm or so is ordinarily necessary.

In the board 31' shown in FIG. 2B according to the present invention, the electronic parts 35 is mounted on the surface thereof and other parts (not illustrated) can be connected and mounted onto the pad 41 by a wire bonding method.

In the present invention, an embodiment of a type can be realized that electronic parts are embedded in a multi-layer board such as a build-up board. A production of a board of this embodiment will be described by referring to FIGS. 4A to 4C.

Figure 4A:
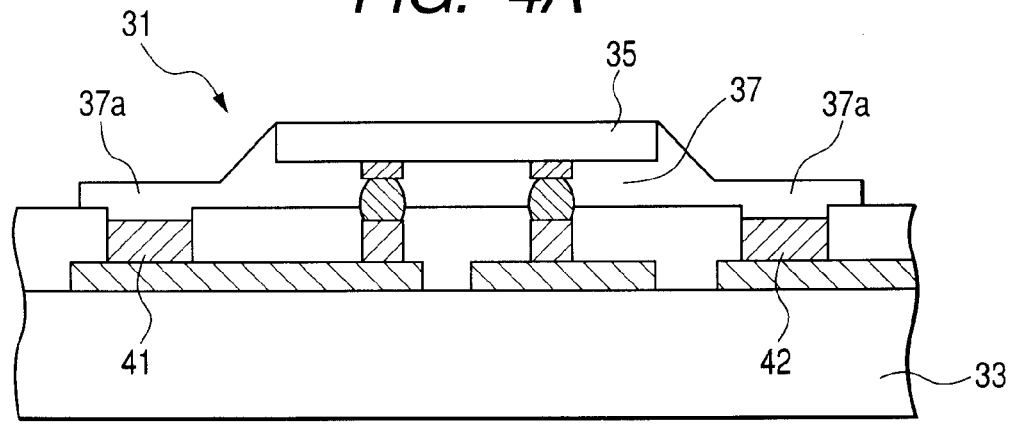
FIGS. 4A to 4C are diagrams for explaining a production of a board of an embodiment according to the present invention in which electronic parts is embedded.
Figure 4B:
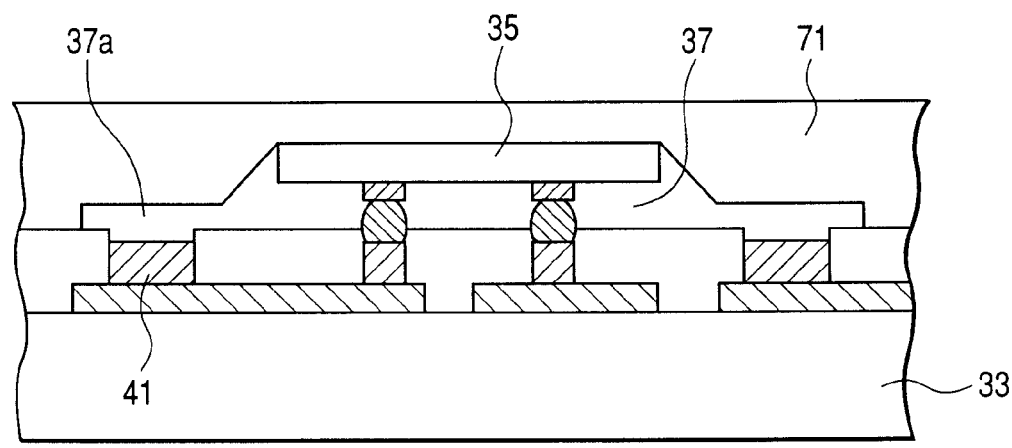
Figure 4C:
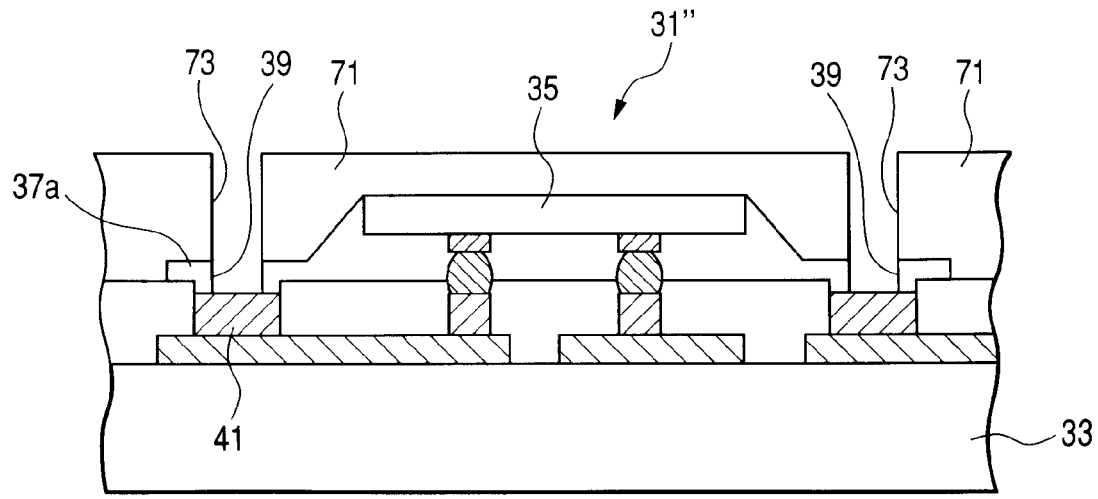

As shown in FIG. 4A, a board 31 of an intermediate product is prepared. The board 31 of the intermediate product is the same as that described with reference to FIG. 2A. Components are respectively designated by the same reference numerals as those of FIG. 2A. Then, a resin material ordinarily used for the build-up board is employed to form an insulating layer 71 for covering electronic parts 35 as shown in FIG. 4B. Subsequently, a drilling work is applied to the insulating layer 71 and a thin layer 37a made of an under-fill material in the periphery of the electronic parts 35 in the same manner as that described by referring to FIG. 2B to form holes 73 and 39 respectively passing through the insulating layer 71 and the layer 37a as shown in FIG. 4C. Thus, a board 31" of the present invention in which the electronic parts 35 is embedded can be obtained that the through hole 73 of the insulating layer 71 communicates with the hole 39 of the thin layer 37a made of the under-fill material in the periphery of the electronic parts 35.

Figure 5:
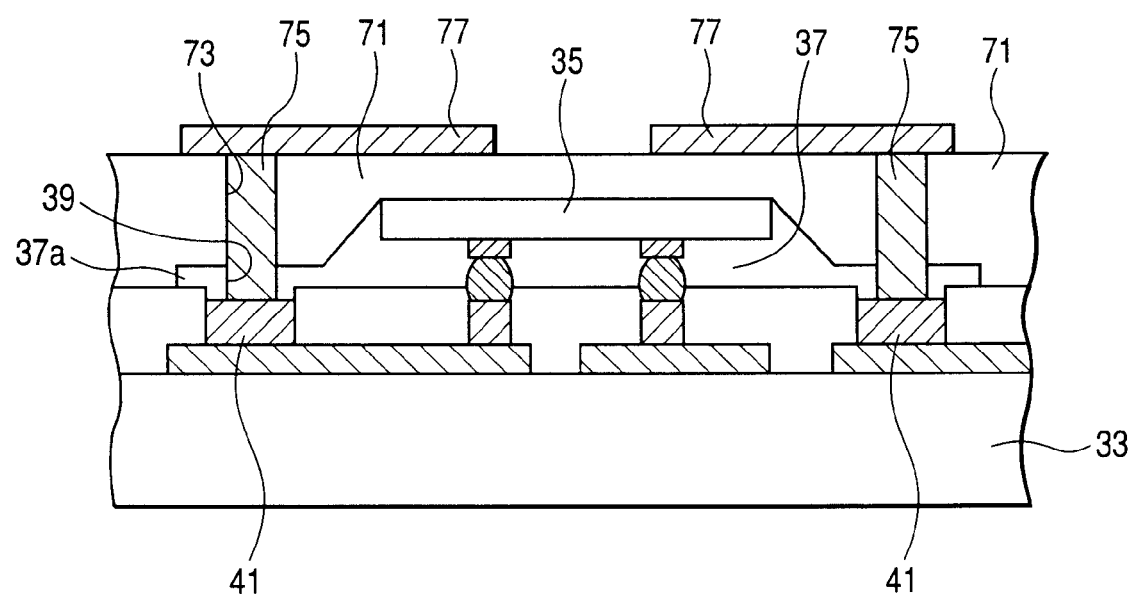
FIG. 5 is a diagram for illustrating a use of the board of the embodiment according to the present invention in which the electronic parts is embedded.

In the board of the present invention in which the insulating layer for embedding the electronic parts 35 is provided and the through hole 73 formed in the insulating layer 71 communicates with the hole 39 formed in the thin layer 37a of the under-fill material in the periphery of the electronic parts 35, as shown in FIG. 5, the hole 39 of the layer 37a of the under-fill material and the hole 73 of the insulating layer 71 are filled with a conductor material 75. A wiring 77 is formed that is connected to a part of the conductor material 75 exposed on the surface of the insulating layer 71 so as to be used for mounting other parts (not illustrated). As the conductor material 75 with which the holes 39 and 73 are filled, for instance, copper plating or an electric conductive paste may be used.

In the multi-layer board in which the electronic parts 35 is embedded as shown in FIG. 5 as an example, to assuredly electrically conduct the electronic parts 35 to the wiring 77 on another layer or conduct different wiring layers together, a hole passing through the insulating layer needs to be formed.

To obtain a high density, it is effective to form such a hole near the electronic parts 35. However, in the board according to the related art in which the outflow of the under-fill material 37 under the electronic parts 35 is prevented by the preventing means such as the dam groove, the hole for connecting upper and lower layers is formed outside a layer formed with the flowing out under-fill material. Thus, the board according to the related art cannot adequately meet a demand for a high density. As compared therewith, according to the present invention, the hole for connecting the upper and lower layers can be formed more closely to the electronic parts, so that the board of the present invention can greatly contribute to a promotion of the high density.

In the above description, the board of the structure on which the electronic parts is previously mounted is used for mounting other parts as illustrated in the drawings. However, it is to be understood that the board of the present invention may be mounted on another mounting board and such a use may be included in the embodiment of the present invention.

What is claimed is:

1. A wiring board comprising:
   a board main body;
   electronic parts mounted on and electrically connected to the board main body; and
   a single-continuous under-fill layer provided between the board and a surface of the electronic part electrically connecting the electronic part to the board,
   wherein a thin layer of the single-continuous under-fill material layer, which is relatively thinner than the single-continuous under-fill material layer disposed between the board and the surface of the electronic part, flows outside a perimeter of a connecting area of the electronic parts,
   wherein a hole is defined in the thin layer to allow electrical connection of additional electronic parts to the board, and
   wherein the hole defined in the thin layer is filled with a conductor material and a wiring is connected to an exposed surface of the conductor material.

2. The wiring board according to claim 1, further comprising an insulating layer in which the electronic parts are embedded, wherein a through hole is defined in the insulating layer that communicates with the hole defined in the thin layer of the single-continuous under-fill material layer.

3. The wiring board according to claim 2, wherein the hole defined in the thin layer of the single-continuous under-fill material layer and the hole defined in the insulating layer are filled with a conductor material.

\* \* \* \* \*

UNITED STATES PATENT AND TRADEMARK OFFICE
CERTIFICATE OF CORRECTION

PATENT NO. : 7,663,253 B2  Page 1 of 1
APPLICATION NO. : 11/463169
DATED : February 16, 2010
INVENTOR(S) : Machida It is certified that error appears in the above-identified patent and that said Letters Patent is hereby corrected as shown below:

In Column 6, Line 25, in Claim 1, after "under-fill" insert -- material --.

Signed and Sealed this

Thirteenth Day of April, 2010

David J. Kappos
*Director of the United States Patent and Trademark Office*